United States Patent
Cohen et al.

(10) Patent No.: US 7,125,785 B2
(45) Date of Patent: Oct. 24, 2006

(54) MIXED ORIENTATION AND MIXED MATERIAL SEMICONDUCTOR-ON-INSULATOR WAFER

(75) Inventors: Guy M. Cohen, Mohegan Lake, NY (US); Alexander Reznicek, Mt. Kisco, NY (US); Katherine L. Saenger, Ossining, NY (US); Min Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 10/865,920

(22) Filed: Jun. 14, 2004

(65) Prior Publication Data

US 2005/0277260 A1   Dec. 15, 2005

(51) Int. Cl.
*H01L 21/20* (2006.01)
(52) U.S. Cl. .................. 438/481; 438/438; 438/199
(58) Field of Classification Search ............. 438/481
See application file for complete search history.

(56) References Cited

U.S. PATENT DOCUMENTS

| | | | | |
|---|---|---|---|---|
| 4,696,097 A | * | 9/1987 | McLaughlin et al. | 438/429 |
| 4,849,371 A | * | 7/1989 | Hansen et al. | 438/348 |
| 4,897,704 A | * | 1/1990 | Sakurai | 257/588 |

OTHER PUBLICATIONS

M. Yang et al., "High-Performance CMOS fabricated on hybrid substrate with different crystal Orientations," Int. Electron Device Meeting (IEDM) Tech. Digest, p. 453, Dec. 2003.
K. L. Saenger, J.A. Ott, J.P. Desouza, and A. Reznicek, "Planar substrate with selected semiconductor crystal orientations formed by localized amorphization and recrystallization of stacked template layers," U.S. Appl. No. 10/725,850.
Sangwoo Pae et al., "Multiple Layers of Silicon-on-Insulator Islands Fabrication by Selective Epitaxial Growth," IEEE Electron Device Lett., vol. 20(5), p. 194 (1999).
T.A. Langdo et al., "High Quality Ge on Si by Epitaxial Necking," Appl. Phys. Lett., 76(25), p. 3700, (2000).

* cited by examiner

*Primary Examiner*—B. William Baumeister
*Assistant Examiner*—Matthew L. Reames
(74) *Attorney, Agent, or Firm*—Duane Morris LLP

(57) ABSTRACT

The present disclosure relates, generally, to a semiconductor substrate with a planarized surface comprising mixed single-crystal orientation regions and/or mixed single-crystal semiconductor material regions, where each region is electrically isolated. In accordance with one embodiment of the disclosure CMOS devices on SOI regions are manufactured on semiconductors having different orientations. According to another embodiment, an SOI device is contemplated as having a plurality of semiconductor regions having at least one of a different semiconductor material, crystalline lattice constant or lattice strain. Methods and processes for fabricating the different embodiments of the invention is also disclosed.

11 Claims, 15 Drawing Sheets

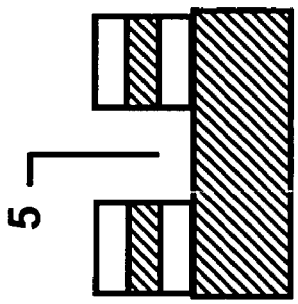
FIG 1C
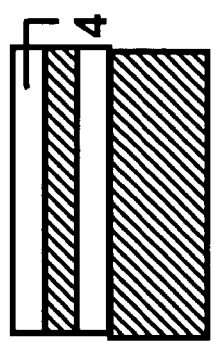
FIG 1E
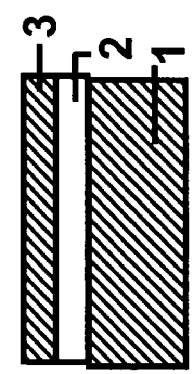
FIG 1A
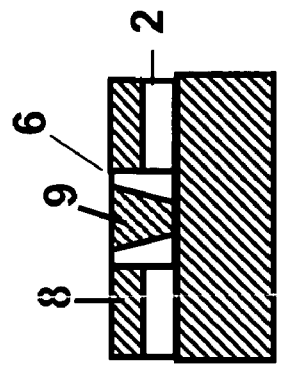
FIG 1F
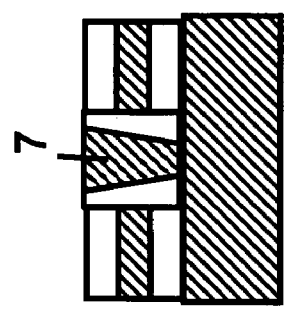
FIG 1B
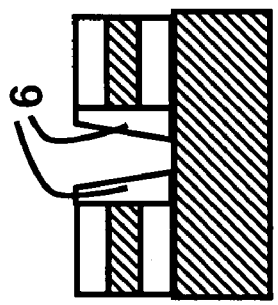
FIG 1D
Fig. 1 (prior art)

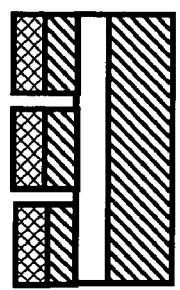
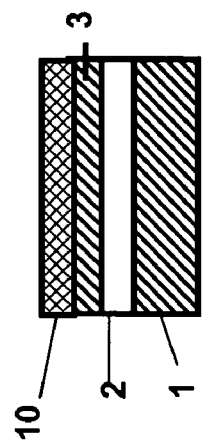
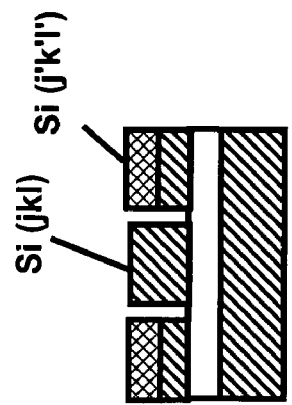
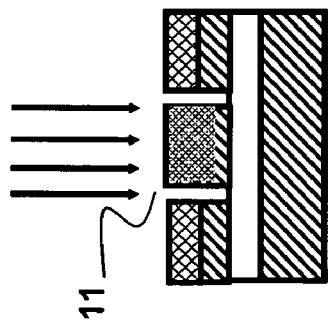
Fig. 2 (prior art)

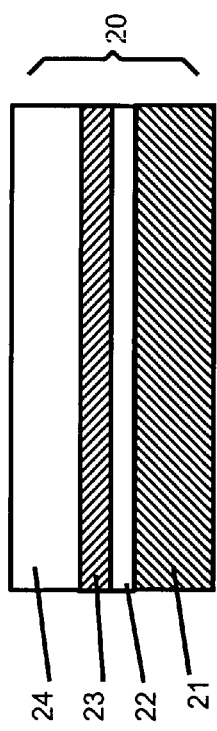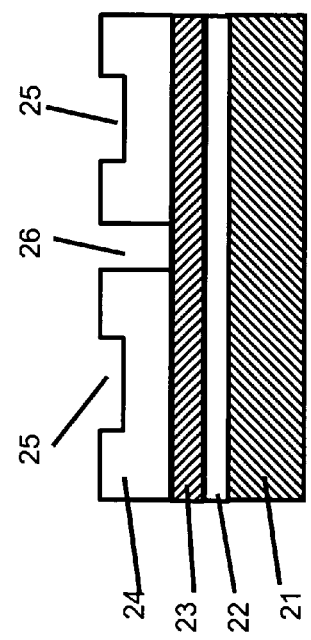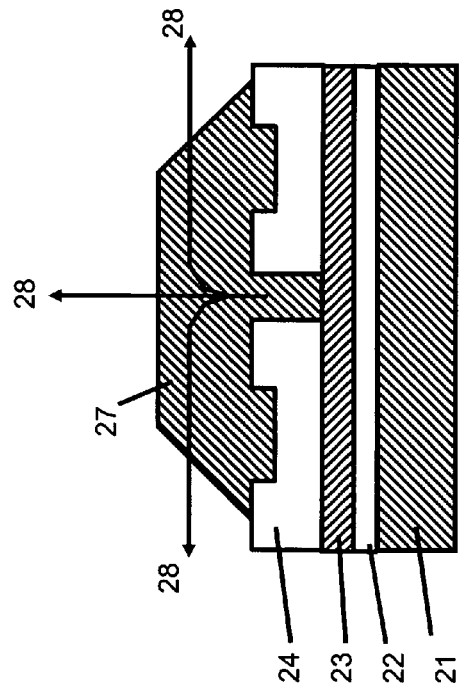

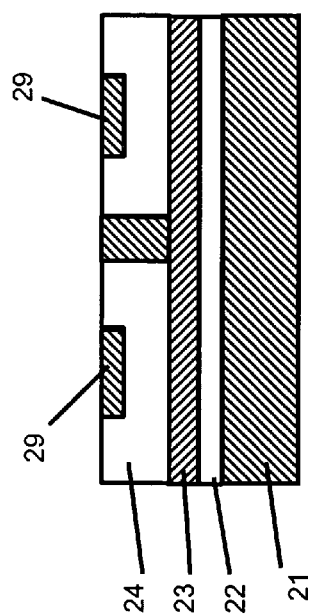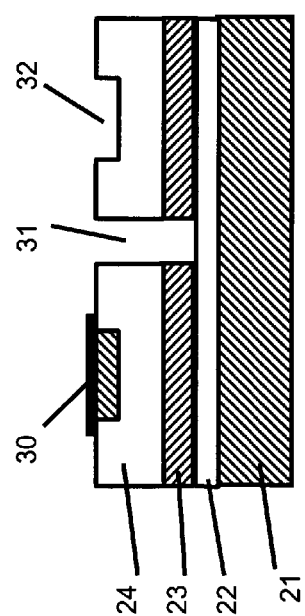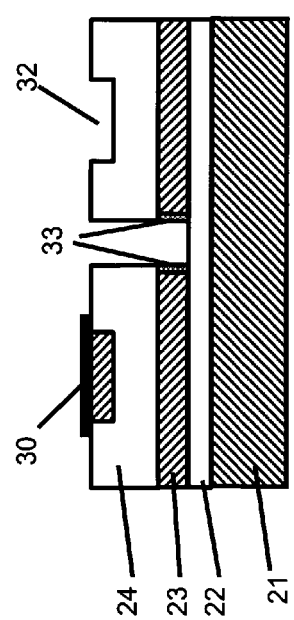

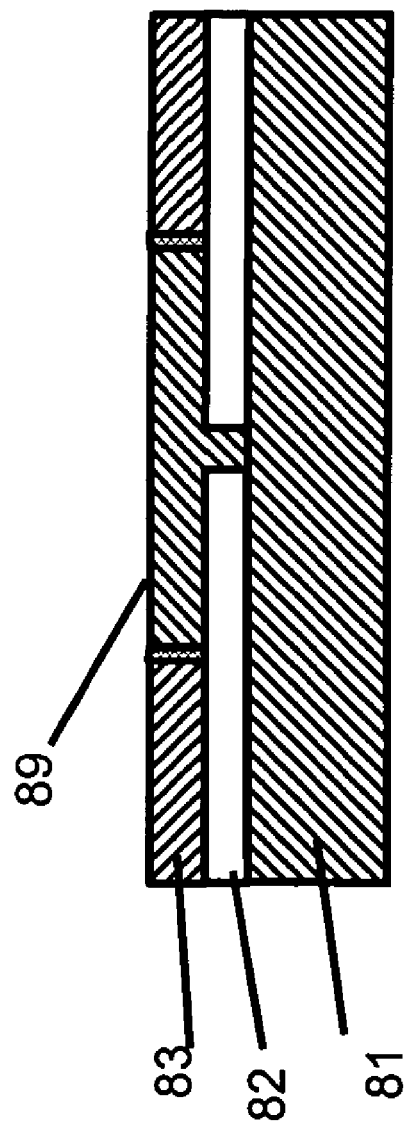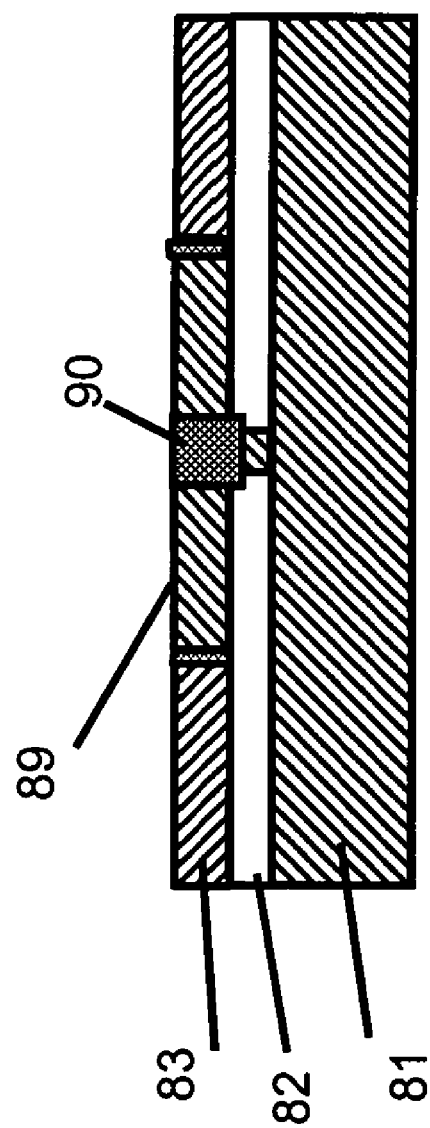

MIXED ORIENTATION AND MIXED MATERIAL SEMICONDUCTOR-ON-INSULATOR WAFER

BACKGROUND

Complementary Metal Oxide Semiconductor ("CMOS") technology is widely used for realizing semiconductor-based electronic circuits. CMOS circuits use both NMOS (electrons) and PMOS (holes) devices. Since a CMOS device-pair consumes power only during switching, CMOS chips require less power than chips using just one type of transistor. CMOS has been particularly attractive for use in battery-powered devices, such as portable computers.

CMOS technology integrates both n-type and p-type MOS devices on the same wafer chip. The current of a field effect transistor ("FET") is proportional to the carrier mobility. PFET carrier mobility is known to be 2.5 times higher on a 110-oriented silicon (Si) wafer than on a 100-oriented Si wafer. Hence, it is desirable to create a hybrid substrate comprising 100-oriented Si where NFETs would be formed and 110-oriented Si where PFET would be formed.

The concept of using different orientations on the same semiconductor may be extended to using different semiconductor materials, since it may be advantageous to fabricate a hybrid substrate with different semiconductor compounds. For example, the bulk hole mobility of germanium (Ge) and the bulk electron mobility of gallium arsenide (GaAs) are, respectively, 4.2 and 5.7 times higher than that of 100-oriented silicon. Thus, a hybrid substrate comprising Ge regions where PFET's would be formed, and GaAs regions where NFET's would be formed may lead to a substantial improvement in FET currents.

Yet another example is related to monolithic integration of optoelectronic devices with CMOS technology. Since silicon has an indirect bandgap, it does not emit light as efficiently as semiconductor materials with a direct bandgap such as GaAs, InP, InGaAs, etc. It would therefore be desirable to fabricate a hybrid substrate comprising silicon regions where CMOS circuits would be formed and InP regions where optoelectronic devices would be formed.

SUMMARY OF THE INVENTION

In one embodiment, the disclosure is directed to a method for fabricating a silicon-on-insulator substrate having hybrid crystal orientation regions and/or mixed single-crystal semiconductor material regions, where each region is electrically isolated.

In another embodiment, the disclosure is directed to a process for fabricating a semiconductor device by providing a wafer having a first semiconductor layer with a first crystalline orientation, a first insulator layer, a second semiconductor layer with a second crystalline orientation and a second insulating layer. A plurality of first and second recesses may be formed on the second insulating layer. Next, the second semiconductor layer may be epitaxially grown to fill the first recesses. Masking the filled recess and growing the first semiconductor layer to fill the second recesses enables the formation of a silicon-on-insulator device having the first and the second crystalline orientations.

In still another embodiment, a method for fabricating a semiconductor on an insulated wafer includes providing a wafer having an insulator layer interposed between a first semiconductor layer and a 'second semiconductor layer. Each of the first and the second semiconductor layers may have a different crystalline orientation. By forming a via to expose the first and the second semiconductor layers and masking certain exposed portions of the second semiconductor layer, the first region may be grown epitaxially. Next, the second semiconductor layer may be exposed and epitaxially grown to form a semiconductor substrate having a plurality of regions formed thereon with each region having a different crystalline orientation or material.

In still another embodiment, the disclosure relates to a silicon-on-insulator material having a plurality of different semiconductor regions with at least one region having a different crystalline strain, a different crystalline lattice constant, a different semiconductor material or a combination thereof as compared with other regions. According to one embodiment of the invention, a silicon-on-insulator material having semiconductor regions with different strains includes providing a wafer having with at least two semiconductor layers separated by an insulating layer and forming vias to expose a surface of each of the two semiconductor layers. Next, each semiconductor layer may be grown epitaxially to fill the vias. By forming an amorphous semiconductor layer to contact each of the first and the second vias and thereby contacting each of the grown semiconductor layers, new layers having different orientations may be formed on the substrate.

BRIEF DESCRIPTION OF THE DRAWINGS

The various embodiments of the disclosure are described with reference to the following non-exclusive illustrations in which similar elements are numbered similarly, and where;

FIGS. 1A–F are cross-sectional views illustrating a conventional process for forming mixed orientation regions of semiconductor-on-insulator and bulk semiconductor, on the same wafer.

FIGS. 2A–2D are cross-sectional views illustrating a conventional process for forming mixed orientation semiconductor-on-insulator regions on a wafer;

FIGS. 4–11 schematically illustrate a process for forming mixed orientation and mixed material semiconductor wafer according to one embodiments of the disclosure;

FIGS. 19–23 illustrate a method for forming a hybrid orientation SOI wafer according to another embodiment of the disclosure;

DETAILED DESCRIPTION

Figure 3A:
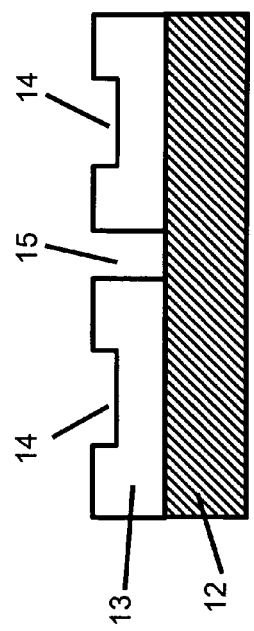
FIGS. 3A–3C are cross-sectional views illustrating a conventional method for forming a silicon-on-insulator wafer.

Examples of conventional approaches for producing planar hybrid substrates are shown in FIGS. 1 and 2. Referring to FIG. 1A, a silicon-on-insulator ("SOI") wafer is prepared by interposing oxide layer 2 (buried oxide) between a handle wafer 1, having a first surface orientation (e.g., 100-orientation) and a SOI layer 3 having a second surface orientation (e.g., 110 orientation). In FIG. 1B oxide layer 4 is deposited over layer 3 as an insulation layer. In FIG. 1C, selected areas of the handle wafer are exposed by etching opening(s) 5 through layers 2–4. Dielectric sidewall spacers 6 are formed to limit silicon growth to layer 1. By allowing epitaxial silicon growth from layer 1, in FIG. 1E silicon layer 7 is formed having the same crystalline orientation as that of layer 1. The resulting structure is shown in FIG. 1F as having silicon layers 8 and 9 with different crystalline orientations and separated by oxide layer 2 and dielectric sidewall spacers 6. This approach is disadvantageous because layer 9 is not insulated from the substrate.

Another conventional approach is shown in FIGS. 2A–2D. In FIG. 2A, substrate 1 and silicon layer 3, shown as having the same surface orientation, are separated by insulator layer 2. Silicon layer 10 is shown as having a different surface orientation than layers 1 and 3 and is chemically bonded to layer 3. FIG. 2B shows trenches are formed in layers 3 and 10 in order to form several sub-regions or islands. In FIG. 2C silicon is implanted into selected sub-regions were and amorphous region 11 is formed. Finally, FIG. 2D shows the same sample after annealing process has been performed so that amorphous portion is rearranged to reach the crystalline phase. It is noted that the top layer arranges its crystalline structure to conform to the underlying template. Thus, the amorphous layer 11 uses the underlying crystalline structure of layer 3 as a template for recrystallization.

This approach has the advantage that all Si orientations may be formed on a buried oxide ("BOX") layer. However, a disadvantage of this method is that it typically relies on hydrophobic (i.e., Si/Si) bonding which is difficult and impractical. In addition, the approach requires either a SIMOX wafer (or SIMOX process step) or an additional hydrophilic bonding step in addition to that discussed above. Another disadvantage is that it cannot be used to form different semiconductor material regions.

Figure 3B:
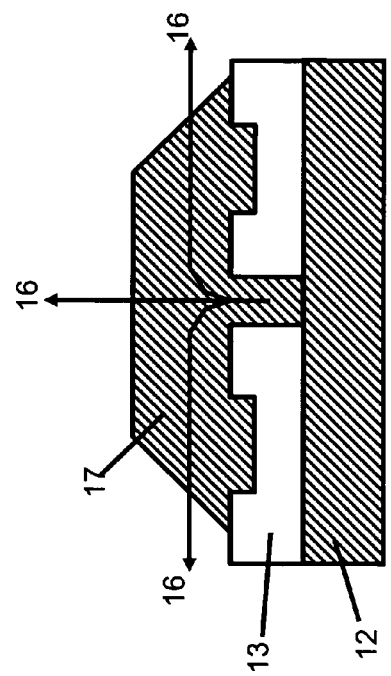
Figure 3C:
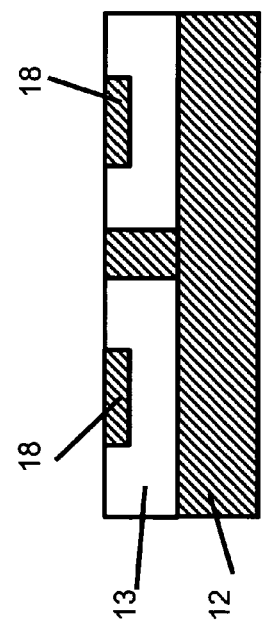

FIGS. 3A–3C are cross-sectional views illustrating a conventional process for forming a silicon-on-insulator wafer. This process uses silicon lateral overgrowth and polishing to form isolated silicon islands. In one embodiment, the present disclosure extends this process to form hybrid orientation and mixed semiconductor material regions on the surface of a single wafer.

Referring to FIG. 3A, silicon substrate 12 is shown as having patterned oxide film 13. The oxide surface is recessed in selected regions 14 and at least one via 15 is formed in the oxide film to provide access to the surface of substrate 12. Silicon 17 in FIG. 3B is epitaxially grown through via 15 by selective epitaxy using silicon substrate 12 as a crystal template. Once epitaxial silicon 17 emerges from via 15 it grows laterally, as indicated by arrows 16. The silicon lateral growth fills the recessed regions 14 with single-crystal silicon 17. The wafer surface may then polished down to the surface level of oxide 13 by chemical mechanical polishing ("CMP") as shown in FIG. 3C. The CMP substantially removes silicon layers above the oxide's top surface while leaving recessed regions 14 filed with epitaxially grown silicon 18. Consequently, single crystal silicon islands 18 (also referred to as silicon-on-insulator) are left embedded in oxide film 13.

FIGS. 4–11 schematically illustrate a process for forming a mixed orientation and mixed material semiconductor wafer according to one embodiment of the disclosure. FIG. 4 shows wafer 20 having silicon substrate 21 with crystalline orientation (100), first oxide layer 22, single-crystal silicon (110) layer 23 and second oxide layer 24. Substrate 21 is also referred to as the handle substrate. While layers 22 and 24 are referred to as oxide layers, it is noted that they are not limited thereto and these layers may be formed from other dielectric materials. Wafer 20 may be fabricated by wafer bonding and layer transfer. For example, a silicon (110) wafer may be implanted with hydrogen (e.g., a Smart-Cut™ process) then flipped and bonded to a handle silicon (100) wafer having an oxide film thereon. The joined wafers may be annealed to strengthen the bond. Additionally, annealing may cause blistering and splitting at the approximate depth where hydrogen was implanted. Following the annealing step, the silicon handle wafer includes a single-crystal silicon (110) layer transferred from the silicon (110) substrate onto the oxide film. To complete the fabrication of wafer 20 an oxide layer may be deposited over the silicon (110) film.

During the next step, as shown in FIG. 5, oxide film 24 is patterned to form recesses 25 and via 26. Oxide 24 may be recessed where silicon-on-insulator regions are desired. Recessed regions 25 are typically defined by conventional lithography and etch. To accurately control the depth of the recessed regions, an etch-stop layer (not shown) may be incorporated into oxide film 24 at the desired depth of region 25. In addition, a set of vias 26 are opened in the oxide film 24 to expose the single-crystal Si (110) layer 23. The exposed surface of Si (110) layer 23 serves as the crystal growth template for the epitaxial growth that follows.

Having formed the appropriate recesses and vias, FIG. 6 shows the lateral overgrowth of silicon (110) through via 26. The epitaxial growth technique may be selective (i.e., there is no deposition of silicon on surfaces other than silicon). An example of a growth technique that provides selective growth of silicon is chemical vapor deposition ("CVD"). Conventional chemical sources used for epitaxial deposition of silicon include silicon tetrachloride ($SiCl_4$) and silane ($SiH_4$). Silicon 27 growing from the opening 26 has the same crystal orientation as layer 23 since it is grown epitaxially. The growth originates from the exposed portion of Si (110) layer 23 and progresses through via 26 and then laterally as indicated by arrows 28. The laterally growing silicon crystal 27 fills recessed regions 25.

Following the epitaxial growth, CMP is used to remove or shave excess silicon 27 that extends beyond oxide layer 24 in order to produce the embodiment illustrated in FIG. 7. Due to the nature of the CMP process, the silicon layer which is formed in recess 25 is not removed. As a result, each of recessed regions 25 will remain filled with single-crystal silicon layer 29 having (110) orientation. It may be readily seen from FIG. 7 that silicon layers 29 are isolated from each other by oxide layer 24.

To form a silicon-on-insulator wafer having mixed orientation and mixed material according to an embodiment of the disclosure, a hard mask layer is placed over silicon layers 29 that are to remain Si (110). FIG. 8 shows hard mask 30 covering polished silicon layer 29 so as to protect this layer from future processing steps. Hard mask 30 also curbs growth from silicon layer 29. An example of a hard mask film is silicon nitride ($Si_3N_4$) but the disclosure is not limited thereto and other known masks may optionally be used.

Next, a selective silicon etch is applied to etch away the unprotected silicon tiles (i.e., where Si (100) is required) and the silicon plug that fills via 26. Etching proceeds through silicon film 23 and extends the depth of via 31 to the oxide layer 22. By way of example, HBr-based chemistry or similar compositions may be used in a reactive ion etching process to selectively etch silicon with respect to $SiO_2$ (the etch selectivity of HBr chemistry is higher than 100:1). Wet chemistry, such as TMAH (Tetramethylammonium hydroxide), which provides a selectivity higher than 1000:1, may also be used.

FIG. 9 illustrates the step of covering sidewalls of via 31 with passivation layer 33 which also cover exposed silicon (110) layer 23. The passivation layer blocks silicon epitaxy from layer 23 while leaving silicon layer 21 exposed for epitaxial growth, after via 31 is extended through layer 22.

Figure 12:
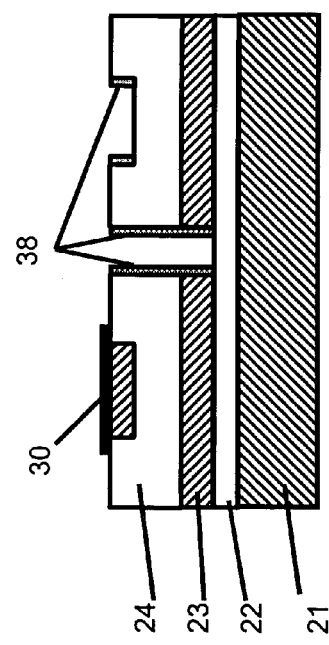
FIGS. 12 and 13(A, B) show exemplary methods for passivating the sidewalls of the semiconductor layer 23.
Figure 13A:
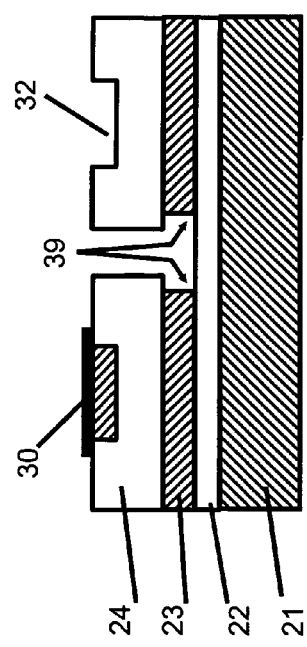
Figure 13B:
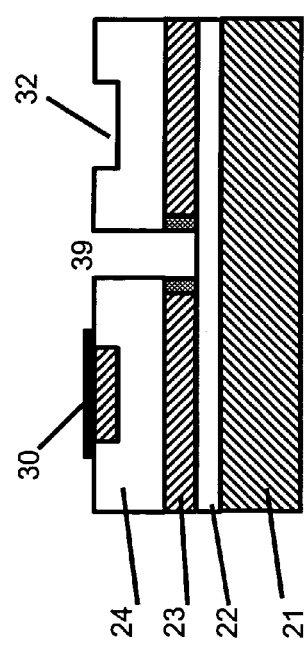

FIGS. 12 and 13 show exemplary methods for passivating sidewalls. FIG. 12 shows silicon (110) sidewalls of layer.23 passivated by forming a sidewall spacer 38 in the via. This may be done, for example, by depositing a blanket film followed by reactive ion etching or sputtering to provide a direction-selective etch. On the other hand, in FIG. 13A undercut sections 39 are formed by etching a portion of silicon layer 23. In FIG. 13B plugs are provided to fill the etched space 39. Plug formation may be performed by depositing a blanket passivation layer followed by reactive ion etching. In yet another embodiment of the disclosure silicon (110) layer 23 sidewalls may be passivated by thermal oxidation.

Following the passivation step illustrated in FIG. 9, via 31 is extended by selectively etching oxide film 22 to thereby expose silicon (100) substrate 21 (not shown). It should be noted that the passivation step discussed in relation with FIGS. 9, 12 and 13 may additionally or alternatively be performed after the selective etching of oxide film 22.

Figure 10:
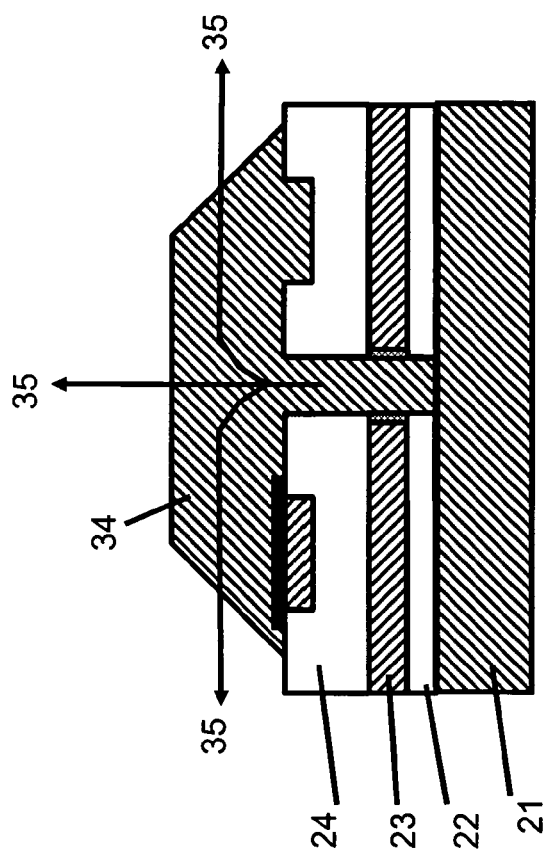

After sidewalls are passivated and silicon (100) layer 21 is exposed, a second selective epitaxial growth may be implemented to grow silicon (100) layer. FIG. 10 shows a second selective epitaxial growth step that uses silicon (100) substrate 21 as a seeding template and fills via 31 with silicon 34 and the unprotected recessed oxide regions 32. As discussed, epitaxial growth will result in silicon 34 having the same crystal orientation as silicon (100) layer 21.

Figure 11:
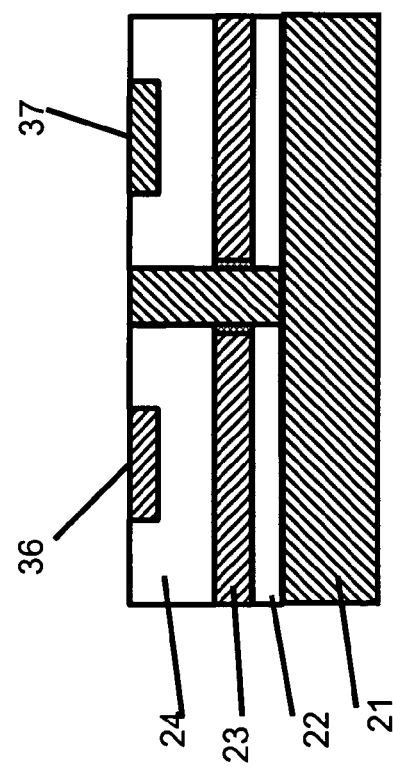

To remove epitaxially grown layer 34 CMP may be performed. FIG. 11 illustrates the wafer after a second CMP step. The CMP removes excess silicon layer 34 which was formed over oxide layer 24. The silicon 34 below the top oxide surface is not removed and silicon (100) tiles 37 are embedded in the oxide 24. The silicon (110) tiles 36 formed by the first CMP step are not affected by the second CMP step since they are also contained below the oxide 24 top surface. Depending on the chemistry, the CMP may also be used to remove the hard mask 30, or it may be etched in a separate step.

According to the embodiment described in relation with FIGS. 4–11, a substrate with a planarized surface having at least two single-crystal silicon orientations may be fabricated. Because the silicon regions are embedded in oxide layer 24, they are electrically isolated. In addition to the isolated silicon-on-insulator regions (36, 37), the wafer's surface may also contain regions of a single-crystal silicon connected to the substrate. Referring to FIG. 11, one such region is the top surface of the planarized via 31 which maintains a silicon orientation (100) similar to that of substrate layer 21. These regions may be referred to as bulk silicon regions. Thus, in accordance with one embodiment of the disclosure CMOS devices on SOI regions may be manufactured having different orientations and at least one bulk silicon region.

Figure 17:
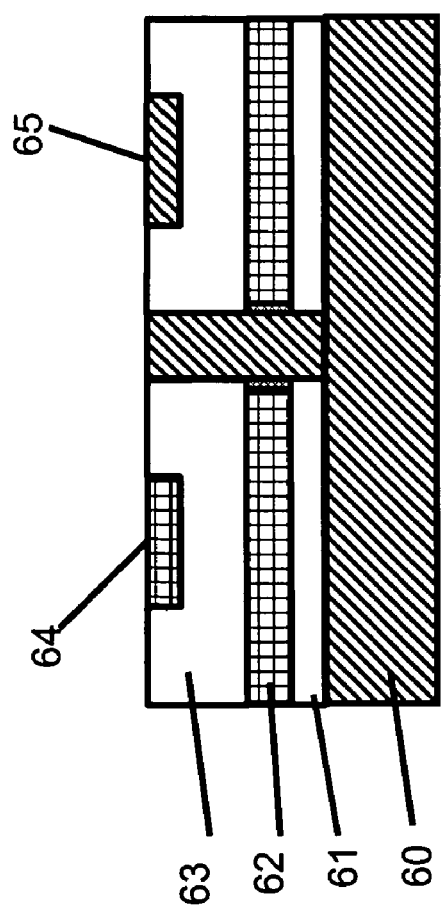
FIG. 17 shows an SOI wafer having different materials on insulator regions.

It is noted that the principles of the disclosure are not limited to forming a hybrid wafer where the only variable is the SOI crystalline orientation as discussed in relation to the exemplary embodiments of FIGS. 4–11. A wafer with a planarized surface and different semiconductor material regions (as compared with different semiconductor orientation) may also be fabricated using the principles of the disclosure. For example, modifying the starting wafer of FIG. 4 by replacing Si (110) layer 23 with Ge (100) film 62 may result in the structure shown in FIG. 17. The structure of FIG. 17 contains Si (100) regions 65 and Ge (100) regions 64 which replace the silicon (110) in the embodiment of FIG. 11. Other semiconductor materials envisioned within the scope of this invention include GaAs, AlGaAs, InGaAs, InP, GaN, SiC, $Si_{1-x}Ge_x$, (0<x<1), and $Si_{1-x}Ge_x$ doped with carbon.

According to still another embodiment of the disclosure, a CMOS device is formed having a plurality of SOI regions with different orientation and/or different semiconductor material. For example, by incorporating an additional crystalline layer of Si (111) in substrate 20 of FIG. 4 it is possible to have three different silicon regions on the wafer with the orientations of (100), (110) and (111) (not shown). According to this embodiment, the epitaxial lateral overgrowth is performed three times. In the first growth step, via 26 may be extended to the first silicon (111) layer surface and may be used as the template for the epitaxial lateral overgrowth. In the second growth step, via 26 may reach the second silicon (110) layer. Finally, in the third growth step the via will reach the silicon (100) substrate. After each growth step, CMP may be performed as discussed earlier to remove lateral overgrowth.

Figures 30A, 30B:
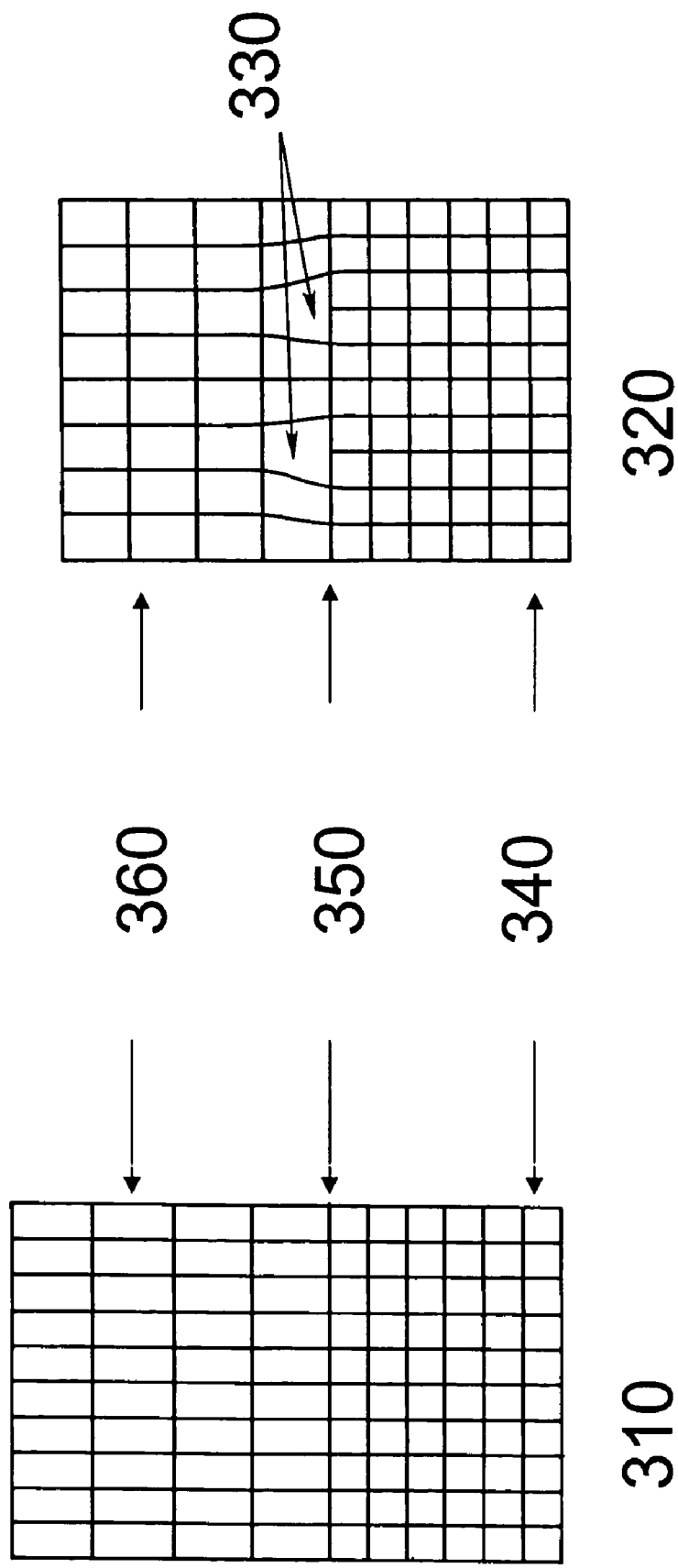
FIGS. 30A and B respectively illustrate a crystalline substrate having a strained crystalline overlayer and a crystalline substrate having a partially relaxed crystalline overlayer.

FIG. 30A and B respectively illustrate a crystalline substrate having a strained crystalline overlayer and a crystalline substrate having a partially relaxed crystalline. Specifically, FIG. 30A shows pseudomorphic SiGe layer 310 and FIG. 30B shows the partially relaxed SiGe layer 320. In both figures, layers 340 illustrate the Si substrate and layers 360 shows the SiGe substrate. The interface of Si and SiGe is schematically shown as layer 350. Ge has a lattice constant which is approximately 4% larger than the lattice constant of Si, and the lattice constant of the alloy $Si_{1-x}Ge_x$ increases approximately linearly with increasing Ge mole fraction (x) of the alloy. Since these semiconductors have cubic symmetry, the in-plane and out-of-plane lattice constants are equal in unstrained. (or "relaxed") crystalline films or bulk crystals In contrast, a strained (or fully strained) SiGe layer is one whose in-plane lattice constant, normally larger than that of the Si substrate, is compressed so as to match the lattice constant of the Si substrate (see FIG. 30A). This results in a corresponding expansion of the out-of-plane lattice parameter such that the in-plane and out-of-plane lattice parameters of the SiGe layer are no longer equal. A SiGe layer is partially strained or partially relaxed when its in-plane lattice parameter is larger than that of Si, but still smaller than the lattice parameter of fully relaxed SiGe (see FIG. 30B). As shown in FIG. 30B, a 60 degree misfit dislocation occur at the hetero-interface between the two layers. The SiGe is fully relaxed or unstrained when the in-plane and out-of-plane lattice parameters are substantially equal. For Si under biaxial tensile strain (e.g., when it is grown epitaxially on a partially or fully relaxed SiGe layer), the in-plane lattice parameter is larger than the out-of-plane lattice parameter as shown.

Figure 14:
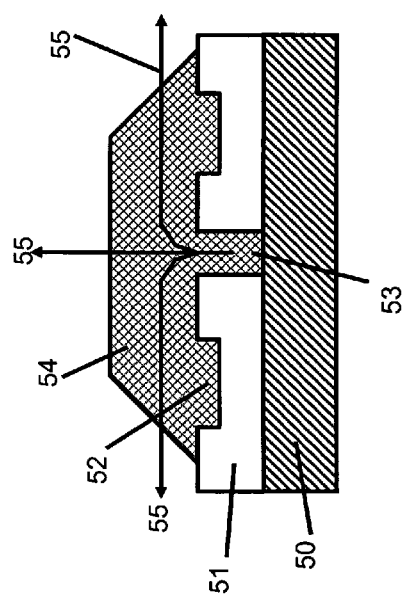
FIGS. 14–16 schematically illustrate a method for fabricating a wafer having strained silicon on insulator.
Figure 15:
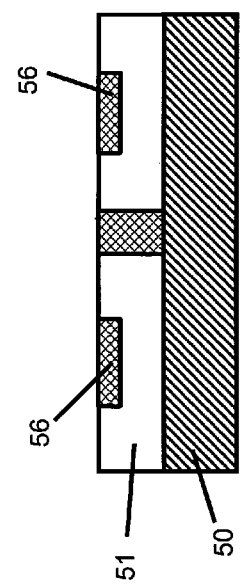
Figure 16:
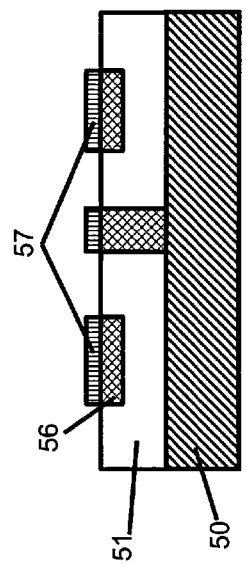

FIGS. 14–16 schematically illustrate a method for fabricating a wafer having strained silicon on insulator. At the outset it should be noted that inducing strain in a semiconductor film may be used to enhance the carrier's mobility. Thus, the embodiments of FIGS. 14–16 show a method for obtaining tensile strain in silicon tiles. The tensile-strained silicon may be achieved by first forming a set of isolated relaxed SiGe tiles and then selectively growing an epitaxial silicon film over the SiGe tiles. Since the SiGe is relaxed, it has a larger lattice constant than that of silicon. The epitaxial silicon is therefore forced to grow on a crystal template having a lattice constant larger than that of the relaxed silicon. The epitaxial silicon film that forms may be considered as tensile-strained.

FIG. 14 illustrates a silicon (100) substrate 50 having thereon patterned oxide layer 51. Oxide layer 51 includes recessed regions 52 and a set of vias 53 that reach to the surface of substrate 50. A selective epitaxial growth of SiGe 54 through via 53 and lateral growth 55 fill the recessed regions 52 with relaxed SiGe 54. The SiGe 54 that grows laterally is relaxed since it does not need to comply to the amorphous oxide layer 51.

Next, the excess SiGe 54 is polished off by CMP (see FIG. 15.) The relaxed SiGe tiles 56 have a polished surface to eliminate surface roughness such as a crosshatch pattern that typically occurs at relaxed SiGe. The thickness of SiGe tiles 56 depend only on the depth of the recessed oxide regions 52 and may therefore be very thin. This is particularly advantageous over the conventional techniques where thick SiGe layers are required to relax the SiGe film.

Referring to FIG. 16, a thin strained silicon film 57 is epitaxially grown over the relaxed SiGe tiles 56. The silicon growth is selective and no deposition takes place on oxide layer 51. The resulting structure incorporates isolated strained-silicon regions and bulk strained-silicon regions over the SiGe that plug vias 53. Having been deposited over polished relaxed SiGe layer 56, strained Si layer 57 will enjoy the natural template of SiGe layer 56.

Figure 18:
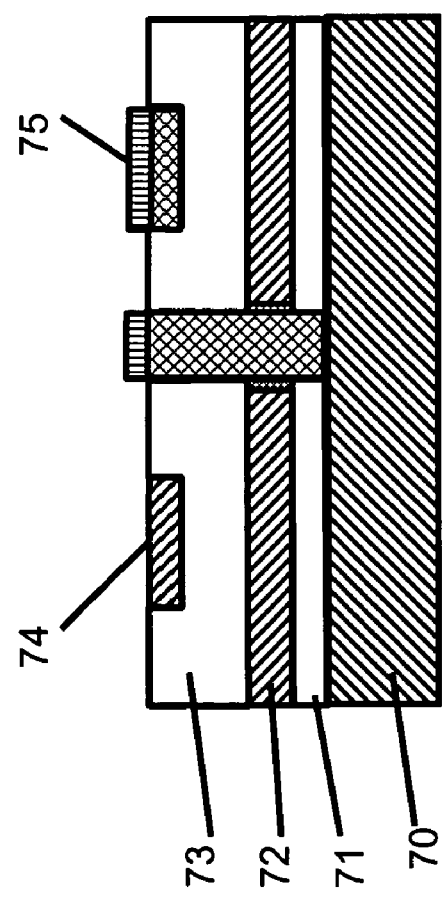
FIG. 18 shows an SOI wafer having different material with strained-silicon on insulator.
Figure 19:
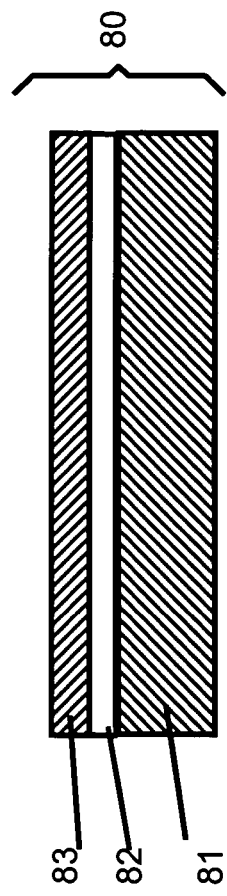

FIG. 18 illustrates a substrate where the method disclosed by FIGS. 14–16 is combined with the teachings of FIGS. 4–14 to produce a substrate having a Si (110) on insulator regions 74 and strained-silicon (100) on insulator regions 75. The Si (110) regions will be populated with PFETs due to the enhanced hole mobility of Si (110) and the strained-Si (100) will be populated with NFET due to the higher electron mobility of strained-Si (100).

Figure 20:
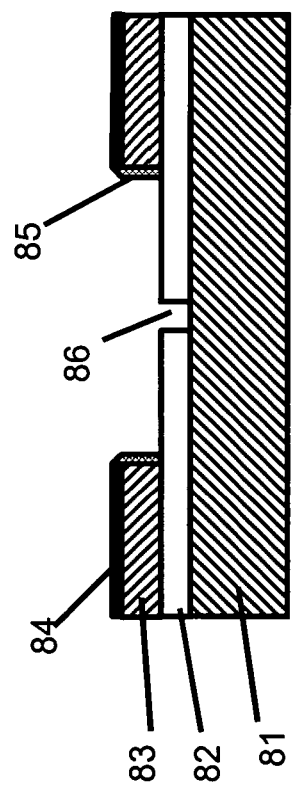

FIGS. 19–23 illustrate a method for forming a hybrid orientation SOI wafer according to another embodiment of the disclosure. The starting wafer 80 shown in FIG. 19, comprises silicon (100) substrate 81, buried oxide layer 82, and silicon-on-insulator (110) film 83. The SOI wafer may be fabricated by wafer bonding as explained in connection with FIG. 4. A hard mask 84 is deposited over silicon (110) layer 83 and is patterned using a mask (not shown) which defines regions in which silicon (110) is to remain. The silicon (110) film 83 is then etched by RIE from those regions not protected by the hard mask 84. Sidewall spaces 85 are formed by a deposition of a film and a blanket etch, or alternatively, by thermal oxidation of the exposed silicon (110) 83 sidewalls. Finally, via 86 is etched through oxide layer 82 to expose the silicon (100) 81 surface as shown in FIG. 20.

Figure 21:
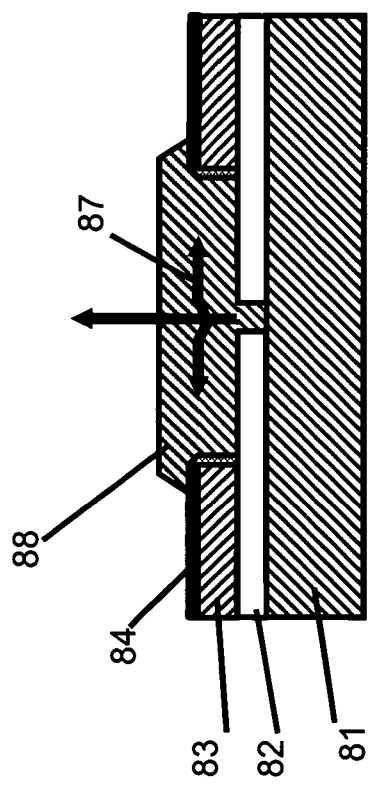

FIG. 21 shows the lateral overgrowth of silicon (100) through via 86 and sideways. The epitaxial growth technique is selective; that is, there is no deposition of silicon on surfaces other than silicon. Silicon (100) 88 grows through the via 86 and expands laterally as indicated by the arrows 87. The growth continues until the entire recessed region is filled with silicon (100) 88. Next, the wafer is planarized by CMP and hard mask 84 is removed as shown in FIG. 22. In this manner, the hard mask may function as a CMP polish stop. It may then be etched off. It is noted from FIG. 22 that the majority of planarized Si (100) layer 89 extends over oxide layer 82.

Planarized silicon (100) layer 89 has a substrate contact formed by the silicon that filled via 86. Where such a contact is not desirable, trench isolation may be used to replace the silicon over via 86 with an isolating material 90 such as oxide layer. FIG. 23 shows planarized silicon (100) 89 that has been isolated from the substrate through filled isolation trench 90 ("plug"). The plug may be formed by etching away planarized Si (100) layer 89 and filling the cavity with oxide 90 in order to isolate planarized Si (100) 89. Comparing this embodiment of the disclosure with a conventional substrate shown in FIG. 1 reveals several advantages. For example, the substrate of FIG. 1F has isolated Si (110) layers 8 whereas Si (100) layer 9 is not isolated. On the other hand embodiment of FIG. 23 has two isolated Si (100) layers 89 and two isolated Si (110) layers 83. Further, Si (100) layer 9 of FIG. 1 is not isolated from the substrate so that devices built on layer 9 will incur a higher junction capacitance. This problem is addressed in the embodiment of FIG. 23 wherein each Si layer sits on an insulated oxide layer.

Figure 24:
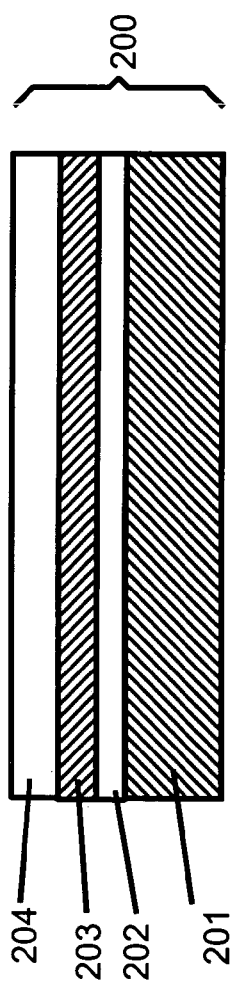
FIGS. 24–28 show embodiments where lateral solid-phase epitaxy ("SPE") is used to fabricate a hybrid orientation substrate.
Figure 25:
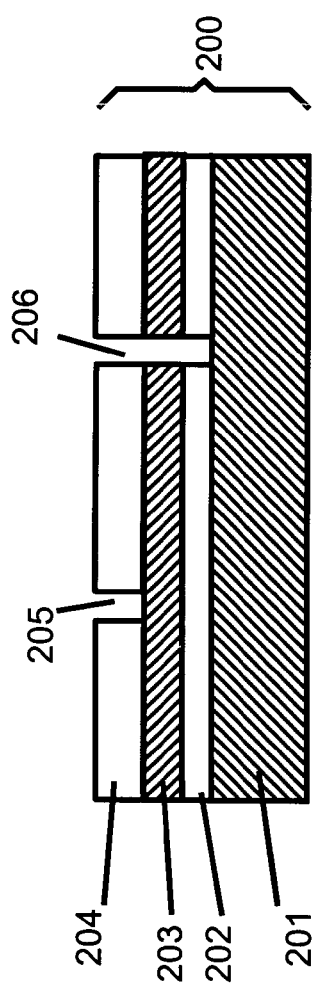
Figure 26:
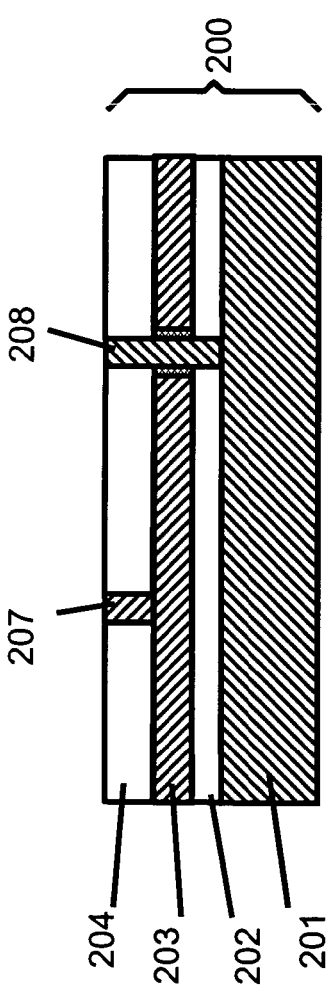

FIGS. 24–28 show embodiments where lateral solid-phase epitaxy (SPE) is used to fabricate a hybrid orientation substrate. Solid-phase epitaxy may be described as a process in which a layer of amorphous semiconductor is recrystallized into a single crystal from a single-crystal seed in contact with the amorphous layer. In contrast, in gas-phase epitaxy (described earlier) semiconductor atoms coming from a gas are added onto a single crystal seed in an order that mimics the seed's crystal structure. FIG. 24 shows starting wafer 200 comprising silicon (100) substrate 201, buried oxide 202 layer 202, silicon (110) layer 203 and second oxide layer 204. Via holes (or trenches) 205 and 206 are formed to expose the silicon (110) layer 203 and silicon (100) layer 201, respectively (FIG. 25). The sidewalls of the exposed silicon (110) 203 are passivated by methods such as those described earlier with reference to FIGS. 12, 13A and 13B. Epitaxial silicon is then formed in vias 205 and 206, for example, by selective epitaxial growth followed by a CMP polish, as shown in FIG. 26. As a result, single-crystal plugs 207 and 208 fill vias 205 and 206, respectively. Thus, crystal plug 207 has (110) orientation as it was grown from a silicon (110) template and crystal plug 208 has (100) orientation as it was grown from a silicon (100) template.

The growth rate of different crystal orientation is typically dissimilar. Hence, it may be desirable to equalize the simultaneous growth through vias 205 and 206 by having the faster growing crystal constitute the substrate (i.e. the deeper via). In another embodiment, it is possible to grow the plugs in two separate steps; for example, by first forming via 205, performing the epitaxial growth, performing CMP and then protecting the newly formed plug silicon layer 207 filling via 205. A second plug may be formed in via 206 by passivating the via sidewalls (see FIG. 26), epitaxially growing silicon (100) from substrate 201 and performing CMP.

Figure 27:
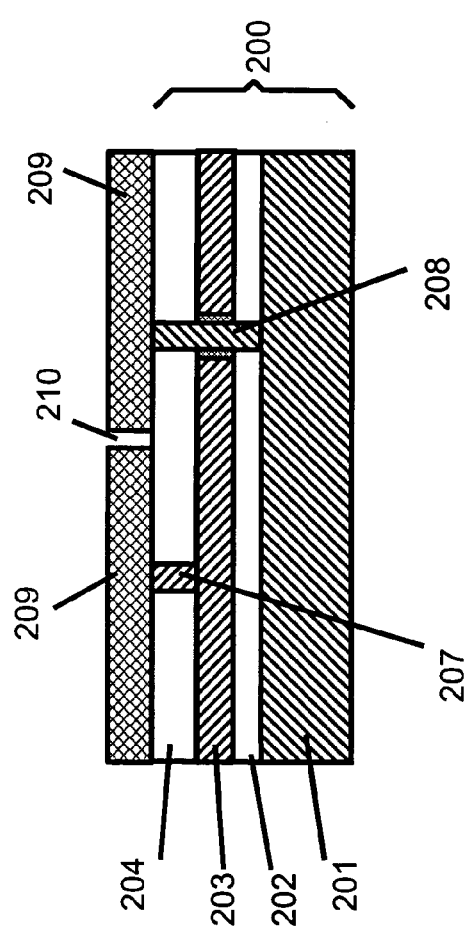

As shown in FIG. 27, a blanket layer of amorphous silicon 209 is then formed on wafer 200. The top surfaces of the silicon plugs 207 and 208 are optionally cleaned and passivated prior to blanket deposition to remove native oxide.

The cleaning step ensures that amorphous layer will be in direct contact with the plug's top surface. The cleaning step may be carried in growth chamber by methods such as oxygen desorption annealing or by surface sputtering with argon gas. The blanket deposition of amorphous layer 209 may be accomplished by methods such as chemical vapor deposition ("CVD"), molecular beam epitaxy ("MBE") or chemical beam epitaxy ("CBE"). Some of the above-mentioned methods may be used for silicon epitaxy. However, for obtaining an amorphous silicon film the deposition parameters are selected such that epitaxy is non-selective (i.e., silicon is deposited over all non-silicon surfaces such as $SiO_2$, $Si_3N_4$ etc.) Alternatively, amorphous silicon layer 209 may be deposited as a partially crystalline or polycrystalline material and then amorphized by ion implementation (e.g., using $Si^+$ or $Ge^+$ ions).

Referring again to FIG. 27, trench 210 forms two regions of amorphous Si 209 and each region is in contact with a different silicon template (i.e., silicon (110) layer 203 and silicon (100) layer 201 both act as seeding templates). By placing amorphous Si layer 209 in contact with the templates, each region will be transformed through solid phase epitaxy to have a similar orientation as that of its respective template. It should be noted that each of the regions isolated by the trench 210 will contain only one single-crystal orientation as dictated by plug 207 or 208. The wafer may then be annealed so that each of the amorphous-Si isolated regions recrystallize in the orientation dictated by its seed 207 or 208.

Figure 28:
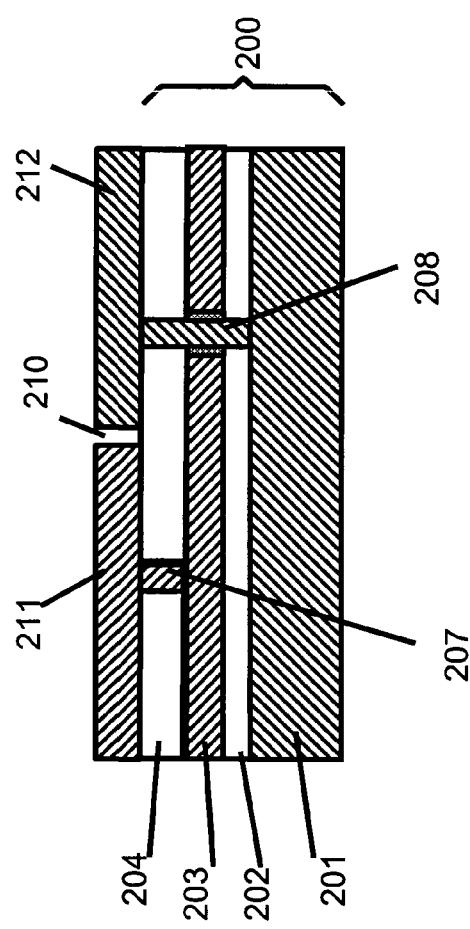

FIG. 28 shows wafer 200 where the amorphous silicon over plug 207 has recrystallized in the (110) orientation 211, and where the amorphous silicon over plug 208 has recrystallized in the (100) orientation 212. Each of the recrystallized silicon regions 211 and 212 is connected to the substrate or the SOI layer through plugs 207 or 208. To isolate these regions, the silicon over the plugs may be etched and refilled with an isolating material following the procedure outlined with reference to FIG. 23.

The embodiment shown in FIG. 28 provides a plurality of SOI regions with each region having a separate crystalline orientation. The principles disclosed in connection with the exemplary embodiment of FIGS. 24–28 may be used with different materials to result in SOI regions having different constituents and/or orientations.

Figure 29:
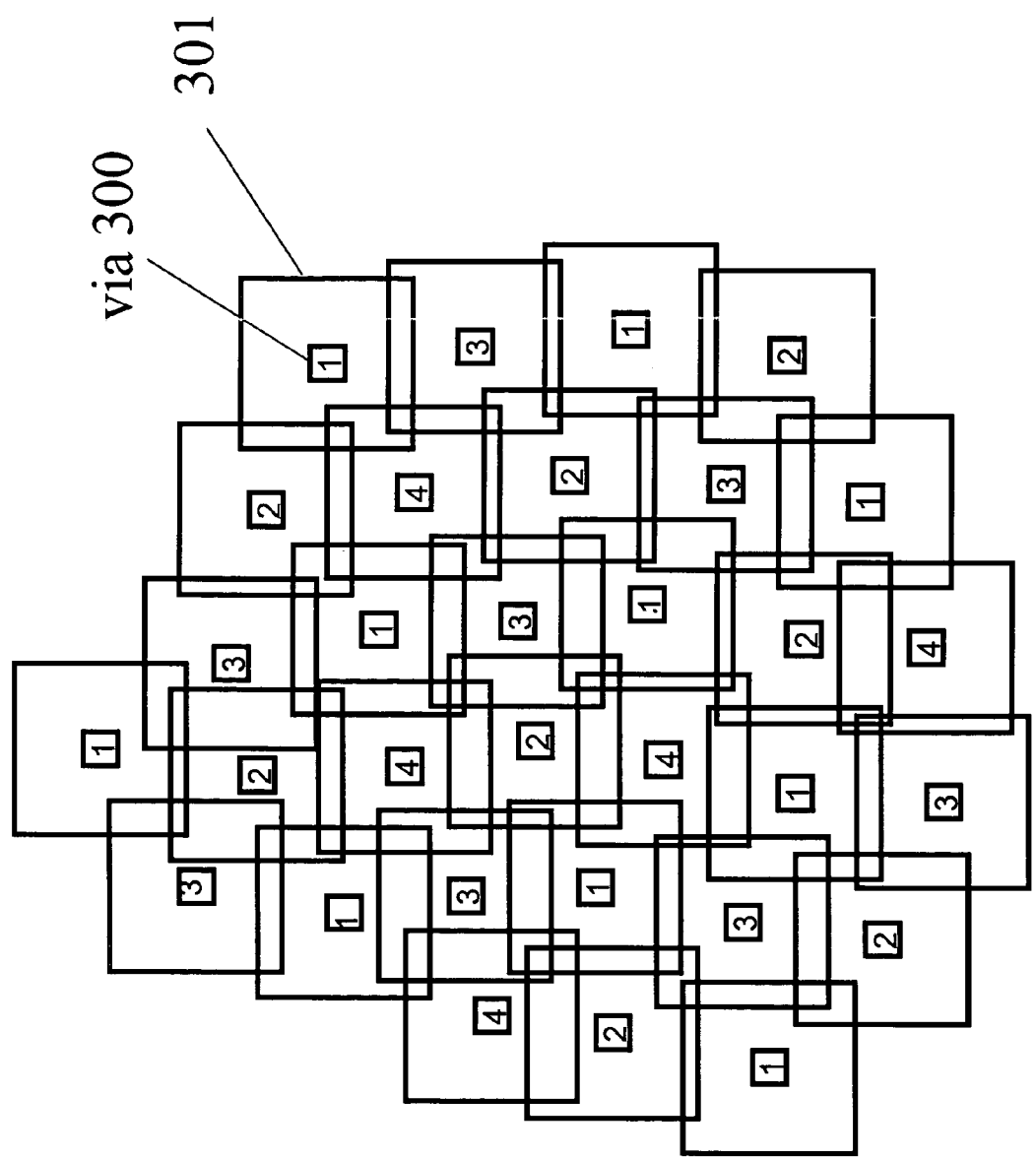
FIG. 29 shows a top view of a plurality of vias and their corresponding lateral overgrowth regions.

When growing a semiconductor laterally from adjacent vias it is preferable to avoid a case in which two crystal fronts will run into each other, since this may lead to crystal defects. The latter scenario is unlikely as vias are typically laid out on a grid. In the case that the via location is random a growth procedure with up to four growth cycles is required as illustrated in FIG. 29. FIG. 29 shows a top view of vias 300 and area 301 occupied by laterally grown crystal through each via. As may be seen adjacent crystals may overlap. To avoid two crystals running into each other the growth is performed in four cycles. First growth is enabled through vias marked with "1". A CMP step may then be used and selected filled cavities may be protected as explained with reference to FIGS. 6–9. During the next step, growth take place from vias marked with "2", followed by CMP and masking of selected filled via. The following step is growth from vias marked "3", and the last growth cycles is carried out using the vias marked "4". It is noted that the four growth cycles are not required even with a random via layout when the method described in FIGS. 24–28 is used. In the latter case, the different region to be re-crystallized 209 are isolated from each other by a trench 210, thus crystal of different region cannot interact.

It is noted that the exemplary embodiments represented herein are not intended to be exclusive and other permutations and modifications can be made that, although not specifically discussed herein, are well within the principles of the disclosure.

What is claimed is:

1. A process for fabricating a semiconductor device, comprising:
   providing a wafer having a first semiconductor layer with a first crystalline orientation, a first insulating layer, a second semiconductor layer with a second crystalline orientation and a second insulating layer;
   forming a first recess and a second recess on the second insulating layer;
   epitaxially growing the second semiconductor layer to fill the first recess;
   masking the filled recess; and
   epitaxially growing the first semiconductor layer to fill the second recess to form a silicon-on-insulator device having the first and the second crystalline orientations
   wherein each of the first and the second crystalline orientations defines a different single crystalline orientation.

2. The process of claim 1, wherein the step of growing the second semiconductor layer to fill the first recess further comprises forming a via in the second insulating layer to expose a surface of the second semiconductor layer.

3. The process of claim 1, wherein the step of growing the second semiconductor layer to fill the first recess further comprises removing an excess semiconductor growth.

4. The process of claim 3, wherein the step of removing excess growth further comprises chemical and mechanical polishing.

5. The process of claim 1, wherein the step of growing the first semiconductor layer to fill the second recess further comprises forming via.

6. The process of claim 5, wherein the step of growing the first semiconductor layer to fill the second recess further comprises passivating growth from the second semiconductor layer.

7. The process of claim 6, wherein the step of growing the first semiconductor layer to fill the second recess further comprises exposing a surface of the first semiconductor layer to crystalline growth.

8. The process of claim 1, wherein growing the first or the second semiconductor layer further comprises epitaxial growing.

9. The process of claim 1, wherein each of the first semiconductor layer and the second semiconductor layer defines a different semiconductor material.

10. A microprocessor having a plurality of silicon on insulator layers prepared according to claim 1.

11. A process for fabricating a semiconductor device, comprising:
    providing a wafer having a first semiconductor layer with a first uniform crystalline orientation, a first insulating layer, a second semiconductor layer with a second uniform crystalline orientation and a second insulating layer;

forming a first recess and a second recess on the second insulating layer;

epitaxial-lateral overgrowing the second semiconductor layer to fill the first recess;

masking the filled recess; and epitaxial-lateral overgrowing the first semiconductor layer to fill the second recess to form a silicon-on-insulator device having the first and the second crystalline orientations.

* * * * *